United States Patent [19]
Fujiwara

[11] Patent Number: 5,175,511
[45] Date of Patent: Dec. 29, 1992

[54] PHASE-LOCKED LOOP SYNTHESIZER FOR USE IN TDM COMMUNICATIONS SYSTEM

[75] Inventor: Ryuhei Fujiwara, Tokyo, Japan
[73] Assignee: NEC Corporation, Tokyo, Japan
[21] Appl. No.: 835,338
[22] Filed: Feb. 14, 1992
[30] Foreign Application Priority Data
  Feb. 14, 1991 [JP] Japan .................................. 3-42738
[51] Int. Cl.⁵ ............................................... H03L 7/00
[52] U.S. Cl. ......................................... 331/18; 331/25
[58] Field of Search ...................... 331/18, 25; 328/14; 455/181, 260; 370/58.1, 95.1, 100.1

[56] References Cited
U.S. PATENT DOCUMENTS
  4,965,533 10/1990 Gilmore ................................ 331/18

Primary Examiner—Robert J. Pascal
Attorney, Agent, or Firm—Foley & Lardner

[57] ABSTRACT

An analog switch is provided in a phase-locked loop (PLL) synthesizer using direct digital synthesizer (DDS) circuitry, for opening a PLL. The PLL is closed to make operative the DDS circuitry and a fixed frequency divider within an idle time slot of each time-division multiplexing (TDM) frame. For the rest of the frame, the voltage-controlled oscillator within the PLL is held in a "hold state".

12 Claims, 3 Drawing Sheets

PHASE-LOCKED LOOP SYNTHESIZER FOR USE IN TDM COMMUNICATIONS SYSTEM

FIELD OF THE INVENTION

This invention relates to a phase-locked loop synthesizer for generating a carrier wave suitable for a radio communications unit utilizing time-division multiplexing (TDM) in which at least a data transmission time slot and an idle time slot are multiplexed in one TDM frame.

BACKGROUND OF THE INVENTION

In a radio communications system utilizing frequency multiplexing and time division multiplexing such as a cellular telephone system, one communication channel is assigned to one portable telephone, or terminal, so that the transmission and reception of data between the terminal and a base station are effected over this communication channel on a time division basis. Since such a radio communications system uses a large number of different frequencies, a phase-locked loop (PLL) synthesizer is used in each terminal as a carrier wave generator to make the terminal tune to an assigned channel, or frequency.

A frequency band assigned to communications channels is comparatively narrow in frequency. In order to efficiently generate a carrier wave having a desired frequency band and to perform fast frequency switching, a direct digital synthesizer (DDS) circuit is utilized to generate a reference frequency signal in the PLL synthesizer. Reference is made to U.S. Pat. No. 4,965,533 issued to R. P. Gilmore on Oct. 23, 1990.

The DDS circuit retrieves waveform data preliminarily stored in a ROM (read-only memory) in each sampling period corresponding to a specified output frequency, generates a digital signal which conforms an output signal of the given output frequency, and then transforms the digital signal into a desired analog signal to form a reference frequency signal. Hence, the reference frequency signal inherently involves a waveform distortion due to quantization errors, which distortion results in spurious signals and degradation in the carrier-to-noise (C/N) ratio of the output signal of a utilizing device such as a transmitter.

Further, since circuit elements such as a digital-to-analog (D/A) converter contained in the DDS circuit must have high speed operability, the synthesizer consumes undesirably great power.

SUMMARY OF THE INVENTION

An object of the invention is, therefore, to overcome the above-mentioned drawbacks inherent in the prior art system. In particular, a primary object of the invention is to provide a phase-locked loop synthesizer, which is operable at low power.

Another object of the invention is to provide circuitry for suppressing adverse effects of quantization errors on a reference frequency signal provided by a direct digital synthesizer circuit.

To attain these objects, there is provided a PLL synthesizer for generating a carrier wave for use with a wireless communication unit utilizing time-division multiplexing of at least a data transmission time slot and an idle time slot in each data transfer frame, comprising: direct digital synthesizer (DDS) circuitry for generating a reference frequency signal; a fixed frequency divider for dividing the frequency of the synthesizer output signal of the PLL synthesizer by a predetermined frequency division ratio; a phase comparator for comparing the phases of the reference frequency signal and the output signal of the fixed frequency divider; a loop filter circuit for smoothing the output signal of the phase comparator; an analog switch provided between the phase comparator and the loop filter circuit; and a voltage-controlled oscillator (VCO) for varying the frequency of the synthesizer output signal in response to the output signal of the loop filter circuit, the analog switch being held in an ON state during a predetermined period of time in the idle time slot and the DDS circuitry and the fixed frequency divider being enabled during the predetermined period of time.

With this construction, the DDS circuitry and fixed frequency divider may be operated only during the predetermined period described above in the data transmission frame and not operated during the rest of the frame. Thus, it is possible to reduce power consumption. In addition, since the voltage of the output signal of the loop filter is held at a specified level over the period of data transfer time slot, the output frequency signal provided from the VCO is not affected by waveform distortion contained in the reference frequency signal provided from the DDS circuitry. Thus, it is possible to suppress degradation in the C/N ratio and generation of spurious signals in, for example, the output of a transmitter.

Further, a phase-locked loop (PLL) formed during the ON state of the analog switch and constituted of the DDS circuitry, fixed frequency divider, phase comparator, loop filter circuit, analog switch and VCO, preferably completes pulling (or locking) of the synthesizer output signal of the VCO to an expected value within the predetermined period of time.

In this manner the frequency of the output signal provided by the PLL becomes the expected frequency in the next data transfer slot, enabling proper transfer of data.

The analog switch preferably has a large output impedance when it is in an OFF state. This may suppress fluctuations in the frequency of the output signal of the VCO while the PLL is left open, thereby maintaining proper oscillatory state of the PLL synthesizer.

The VCO preferably has a large input impedance. This may also suppress the frequency fluctuations in the signal output from the VCO, thereby further stabilizing the oscillatory state of the synthesizer.

DETAILED DESCRIPTION OF THE PREFERRED EMBODIMENT

An embodiment of the invention will now be described with reference to the drawings.

Figure 1:
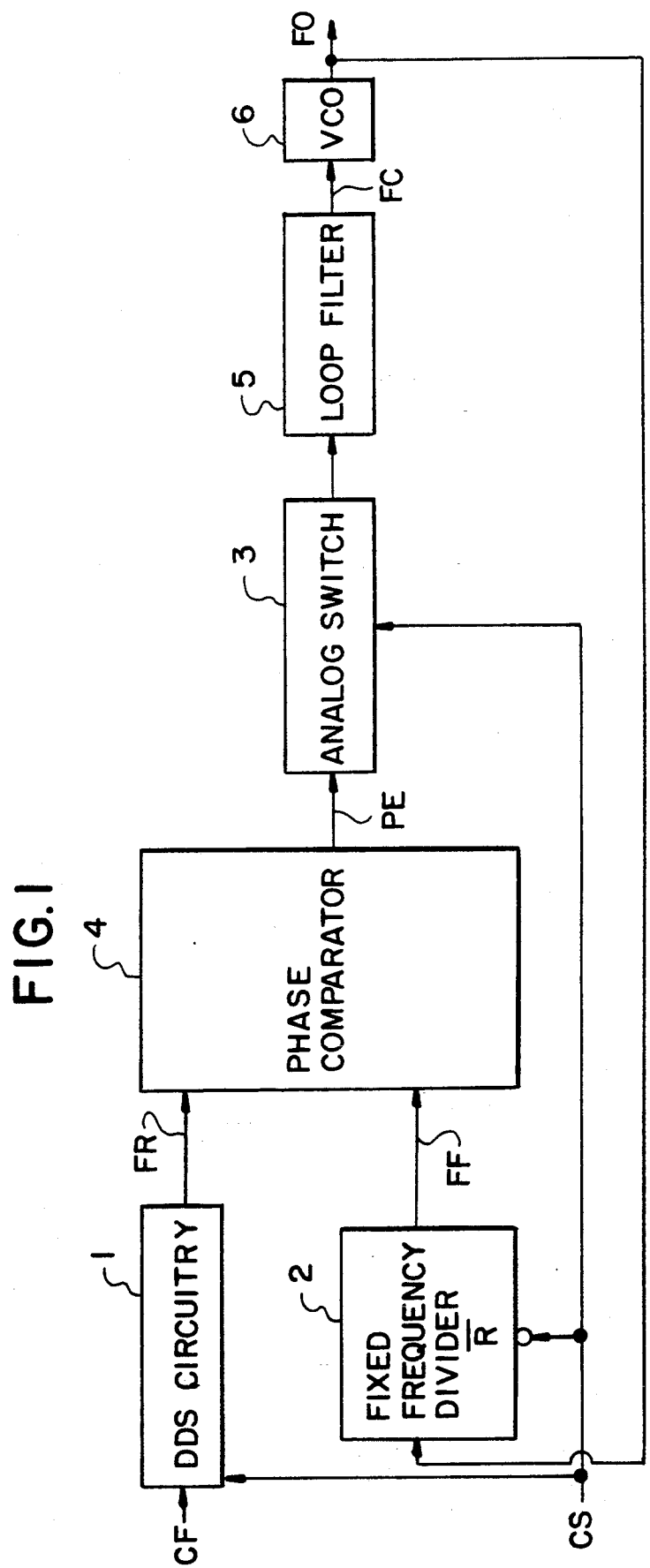
FIG. 1 is a block diagram of a phase-locked loop synthesizer embodying the invention.

Referring now to FIG. 1, a control operation signal CS, which is furnished by a control unit (not shown), is applied to a control signal input of direct digital synthesizer (DDS) circuitry 1, a reset input R of a fixed frequency divider 2 which is reset by negative logic, and to a control signal input of an analog switch 3. This application of the signal CS allows a phase-locked loop to be established within an idle time slot in each TDMA frame.

The DDS circuitry 1 may generate a reference frequency signal FR having a reference frequency specified by a frequency designation signal CF supplied from a higher rank controller when the control operation signal CS is at a high (H) logic level. The reference frequency signal FR is applied to a reference signal input terminal of a phase comparator 4.

When the level of control operation signal CS is high (H), the fixed frequency divider 2 becomes operable since the reset input R is then high, so that the fixed frequency divider 2 divides the frequency of the output signal FO of the PLL synthesizer by a predetermined frequency division ratio. The resultant output signal is applied as a feedback frequency divided signal FF to a comparison signal input of the phase comparator 4. The phase comparator 4 compares the phases of the reference frequency signal FR and feedback frequency divided signal FF to generate a phase error signal PE having a pulse duration corresponding to the result of the comparison. The phase error signal PE is supplied to the analog switch 3.

The analog switch 3 outputs an input phase error signal PE to a loop filter 5 when the level of control operation signal CS is high (H). The loop filter 5 generates a frequency control signal FC having a voltage corresponding to the pulse width of the phase error signal PE from the analog switch 3. The frequency control signal FC is supplied to a voltage-controlled oscillator (VCO) 6.

The VCO 6 generates a signal having a frequency corresponding to the voltage of the input frequency control signal FC. The signal thus generated is output as an output signal FO to an external device, part of which signal is available as a feedback signal to the fixed frequency divider 2.

As an illustration, when the frequencies of the reference frequency signal FR and output signal FO are 1 and 900 MHz, respectively, the frequency division ratio of the fixed frequency divider 2 is 1/900.

Figure 2:
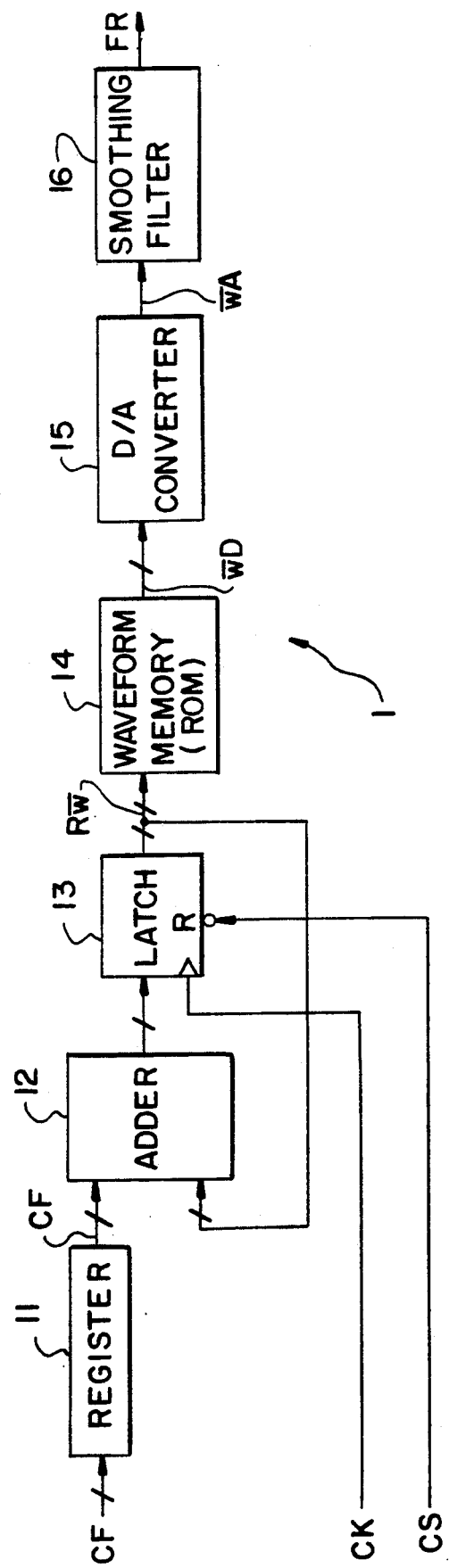
FIG. 2 is a block diagram showing an example of direct digital synthesizer circuitry.

FIG. 2 shows an example of the DDS circuitry 1. In FIG. 2, a register 11 stores a frequency designation signal CF, which is supplied to one of the input terminals of an adder 12. A latch 13 receives the output data of the adder 12 at the rising edge of a system clock signal CK furnished by a clock generator (not shown). The output data RW of the latch 13 is supplied to the other input terminal of the adder 12 and also to an address input terminal of a waveform memory 14. The reset terminal R of latch 13 is provided with the control operation signal CS.

The waveform memory 14 may be a non-volatile semiconductor memory such as a ROM, for storing digital waveform signals formed by sampling in specified bits at predetermined sampling intervals a sinusoidal signal having a predetermined amplitude. The outputs of the memory are waveform data WD which correspond to data RW input to its address input terminal.

A digital-to-analog (D/A) converter 15 converts the waveform data WD into a corresponding analog signal, and supplies the resultant analog signal as an analog waveform signal WA to a smoothing filter 16. The smoothing filter 16 smoothes the analog signal WA to produce a reference frequency signal FR.

The frequency of the system clock signal CK is preferably about 20 MHz.

In the above example, the latch 13 is operable during those periods when the level of control operation signal CS is high. Consequently, the DDS circuitry 1 is also operative over the periods, as described further in detail below.

At the beginning of such a period as mentioned above, data latched in the latch 13 is "0", so that this "0" is supplied to one of the input terminals of the adder 12 at this moment. Therefore, waveform data WD output from the waveform memory 14 is the waveform data associated with this address "0". This data WD is supplied to the D/A converter 15. Thus, the smoothing filter 16 receives an analog signal WA having a waveform associated with the phase "0".

The adder 12 executes addition quicker than the cycle period of the system clock signal CK to thereby output data identical with data CF stored in the register 11. The output data of the adder 12 is then latched in the latch 13 with the same timing as the system clock signal CK. The latch 13 thus outputs the value of the data CF stored in the register 11, to the other input terminal of the adder 12. At the same time, the waveform data WD stored at address "CF" of the waveform memory 14 is retrieved therefrom and supplied to the D/A converter 15. Thus, the smoothing filter 16 is provided with an analog signal WA having a waveform corresponding to the phase "CF".

In this manner the operations of the adder 12 are repeated, increasing the data stored in the latch 13 by the magnitude of the data CF every time a system clock signal CF is provided. Thus, the waveform memory 14 provides waveform data WD corresponding to the address "CF" associated with the time as specified by the system clock CK. The smoothing filter 16 receives an analog waveform signal WA corresponding to the data WD.

In this way, the waveform analog signal WA input to the smoothing filter 16 is an analog signal which varies in frequency in accordance with the data CF stored in the register 11. As a result, a reference frequency signal FR associated with data CF may be output from the smoothing circuit 16.

It should be noted that when data in the adder 12 overflows, the adder is reset and repeats the operation with value "0".

Figure 3:
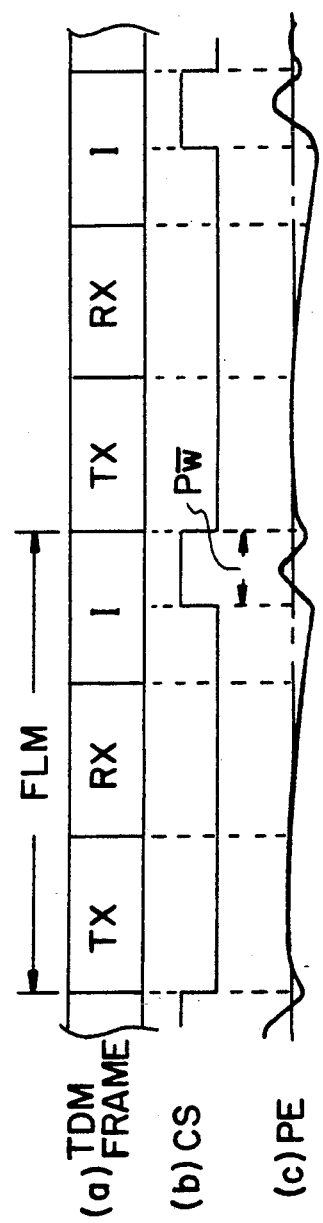
FIG. 3 is a timing chart, provided to explain the operation of the synthesizer shown in FIG. 1.

In the configuration mentioned above with the PLL-DDS circuitry used in a time division multiplexing radio communications system in which a period cycle or a TDM frame FLM of data transfer consisting of a transmission time slot TX for data transmission, a reception time slot RX for data reception, and an idle time slot I for pausing operation as shown in FIG. 3(a), the control operation signal CS is raised to the H logic level at a time within the idle time slot I by a higher rank controller, as shown in FIG. 3(b), in which PW represents the period of the H logic.

The DDS circuitry 1 and the fixed frequency divider 2 are enabled by the high level control operation signal, and the analog switch 3 is turned on, thereby closing the PLL within the DDS circuitry.

Accordingly, the direct digital synthesizer circuitry 1 provides a reference frequency signal FR having a frequency designated by the frequency designation signal CF, and the phase comparator 4 provides a phase error signal PE (FIG. 3(c)) corresponding to the phase difference between the reference frequency signal FR and a feedback frequency signal FF. Therefore, the frequency of the output signal FO of VCO 6 is altered to a value corresponding to the phase error signal PE. This implies that the output signal FO varies in frequency in a direction such that the phase error approaches 0.

In operation towards the end of the period PW, the phase synthronization loop operates at a frequency which is substantially the same as the expected frequency. Accordingly, the frequency of the signal FO output from the VCO 6 attains the expected magnitude.

At the end of the period PW when the control operation signal CS falls to the logic level L, the analog switch 3 is turned off, rendering the PLL opened. The level of the frequency control signal FC at the input of VCO 6 is subsequently lowered by the discharge through circuit elements between the output end of the analog switch 3 and the input end of VCO 6. Correspondingly, the phase of the output frequency signal FO is gradually modified.

However, by setting as high both the output impedance of the analog switch 3 when it is turned off and the input impedance of VCO 6 as possible, it is possible to suppress the reduction of the frequency control signal FC, thereby suppressing changes in frequency of the output signal FO until the PLL is closed again. This may be realized by constructing the input portion of VCO 6 by a voltage follower circuit using an operational amplifier constituted by complementary metal-oxide semiconductor (CMOS) devices.

In short, power that must be consumed by the PLL is greatly saved, since the operation of the DDS circuitry 1 in the embodiment described above is limited only for period PW, which is a part of the periodic cycle or data transfer frame FLM.

In a digital cellular telecommunication system required by RCR (Research and Development Center for Radio Systems: Japan) STD-27, one TDM frame has a duration of 20 milliseconds (ms), an idle time slot lasts about 5.7 ms and thus the period PW can be about 2 ms. Therefore, the battery saving efficiency of DDS circuitry embodying the present invention will be one-tenth that of the conventional DDS circuitry which is continuously powered.

Further, an output FO having little distortion in waveform may be furnished even while the DDS circuitry 1 is in an OFF state, since then the output frequency signal FO is not affected by a quantization error inherently included in the reference frequency signal FR provided by the DDS circuitry 1, and since the PLL of the DDS circuitry may be held in a "hold state" (least dissipative state) during the OFF periods.

It should be understood that in obtaining the above advantages of the invention the configuration of the time slots may be different from the one illustrated herein.

What is claimed is:

1. A phase-locked loop (PLL) synthesizer for generating a carrier wave for use with a radio communications unit utilizing time division multiplexing of at least a data transmission time slot and an idle time slot in each data transfer frame, comprising:
    direct digital synthesizer (DDS) circuitry for generating a reference frequency signal;
    a fixed frequency divider for dividing the frequency of the synthesizer output signal of said PLL synthesizer by a predetermined frequency division ratio;
    a phase comparator for comparing the phases of said reference frequency signal and the output signal of said fixed frequency divider;
    a loop filter circuit for smoothing the output signal of said phase comparator;
    an analog switch provided between said phase comparator and said loop filter circuit; and
    a voltage-controlled oscillator (VCO) for varying the frequency of said synthesizer output signal in response to the output signal of said loop filter circuit,
    said analog switch being held in an ON state during a predetermined period of time in said idle time slot and said DDS circuitry and said fixed frequency divider being enabled during said predetermined period of time.

2. A PLL synthesizer according to claim 1, wherein a phase-locked loop formed during said ON state of said analog switch, constituted of said DDS circuitry, fixed frequency divider, phase comparator, loop filter circuit, analog switch and VCO, is adapted to complete pulling of said output signal of said VCO so that the synthesizer output signal attains an expected frequency within said predetermined period of time.

3. A PLL synthesizer according to claim 2, wherein said analog switch has a large output impedance when it is in an OFF state.

4. A PLL synchteizer according to claim 3, wherein said VCO has a large input impedance.

5. A phase-locked loop (PLL) synthesizer for use in a time-division multiplexing (TDM) communications system using TDM frames each of which includes at least an idle time slot, said synthesizer comprising:
    direct digital synthesizer (DDS) means for generating a reference frequency signal, said DDS means being enabled in response to a control signal;
    voltage-controlled oscillator (VCO) means for generating an oscillation signal in accordance with a control voltage;
    phase comparator means for phase comparing said reference frequency and oscillation signals to produce a phase error signal representative of a phase difference therebetween;
    filter means for filtering said phase error signal to produce a filtered voltage and supplying said filtered voltage to said VCO means as said control voltage; and
    switching means connected between said phase comparator and filter means for selectively passing said phase error signal to said filter means in response to said control signal, said control signal being applied to said DDS and switching means for a predetermined period of time within said idle time slot.

6. A PLL synthesizer as claimed in claim 5, wherein said switching means comprises an analog switch.

7. A PLL synthesizer as claimed in claim 5, further comprising fixed frequency divider means connected between said VCO and phase comparator means for frequency dividing said oscillation signal by a predetermined frequency division ratio.

8. A PLL synthesizer as claimed in claim 5, wherein said DDS means comprises:
    register means for registering a frequency designation signal;
    adder means for adding the registered frequency designation signal and a latched signal to produce an added signal;

latch means for latching said added signal in response to a clock signal to produce said latched signal, said latch means being reset in response to said control signal;

waveform memory means for storing digital waveform signals formed by sampling in specified bits at predetermined sampling intervals a sinusoidal signal having a predetermined amplitude and for producing digital output data in response to said latched signal;

digital-to-analog converter means for converting said digital output data into an analog signal; and smoothing filter means for smoothing said analog signal to produce said reference frequency signal.

9. A PLL synthesizer as claimed in claim 8, wherein said DDS means is comprised of complementary metal-oxide semiconductor (CMOS) devices.

10. A PLL synthesizer as claimed in claim 8, wherein said waveform memory means comprises a read-only memory (MOS).

11. A method of reducing power consumption on a phase-locked loop (PLL) synthesizer including direct digital synthesizer (DDS) circuitry, comprising the steps of:

generating an oscillation signal in accordance with a control voltage;

comparing the phases of said oscillation signal and the output of said DDS circuitry to produce an error signal;

filtering said phase error signal to produce and apply a filtered voltage to said generating step as said control voltage;

disabling said DDS circuitry for a predetermined period of time within an idle time slot of a time-division multiplexing (TDM) frame; and inhibiting said phase error signal from reaching said filtering step for said predetermined period of time.

12. A method as claimed in claim 11, further comprising the steps of:

dividing the frequency of said oscillation signal by a predetermined division ratio with a frequency divider; and disabling said frequency divider for said predetermined period of time.

* * * * *